United States Patent
Arcus

[19]
[11] Patent Number: 6,124,741
[45] Date of Patent: Sep. 26, 2000

[54] ACCURATE PLL CHARGE PUMP WITH MATCHED UP/DOWN CURRENTS FROM VDS-COMPENSATED COMMON-GATE SWITCHES

[75] Inventor: Christopher G. Arcus, San Jose, Calif.

[73] Assignee: Pericom Semiconductor Corp., San Jose, Calif.

[21] Appl. No.: 09/264,284

[22] Filed: Mar. 8, 1999

[51] Int. Cl.[7] .................................................. H03K 3/00
[52] U.S. Cl. ............................................. 327/112; 326/83
[58] Field of Search ................................. 327/108, 111, 327/112, 103, 434, 427; 329/83

[56] References Cited

U.S. PATENT DOCUMENTS

| | | | |
|---|---|---|---|
| 4,331,889 | 5/1982 | Parrish | 307/311 |
| 5,003,197 | 3/1991 | Nojima et al. | 307/296.2 |
| 5,155,384 | 10/1992 | Ruetz | 307/296.8 |
| 5,285,114 | 2/1994 | Atriss et al. | 307/264 |
| 5,362,990 | 11/1994 | Alvarez et al. | 327/538 |
| 5,412,349 | 5/1995 | Young et al. | 331/34 |
| 5,422,529 | 6/1995 | Lee | 327/536 |
| 5,502,411 | 3/1996 | Matsuki et al. | 327/156 |
| 5,508,660 | 4/1996 | Gersbach et al. | 331/17 |
| 5,532,636 | 7/1996 | Mar et al. | 327/543 |
| 5,642,082 | 6/1997 | Jefferson | 331/25 |
| 5,646,563 | 7/1997 | Kuo | 327/112 |
| 5,663,686 | 9/1997 | Tada | 331/8 |
| 5,734,279 | 3/1998 | Bereza | 327/112 |
| 5,736,880 | 4/1998 | Bruccoleri et al. | 327/157 |
| 5,767,736 | 6/1998 | Lakshmikumar et al. | 327/536 |

*Primary Examiner*—Jung Ho Kim
*Attorney, Agent, or Firm*—Stuart T. Auvinen

[57] ABSTRACT

A more accurate charge pump reduces phase error in a PLL. An UP input pulse causes a p-channel drive transistor to charge a filter capacitor on the output, while a down DN input pulse causes an n-channel drive transistor to discharge the output. The drive transistors are connected to power or ground through a supply transistor. The supply transistor is biased on in the linear region and is not switched off. The sources of the drive transistors are always driven by the supply transistors, preventing phase error from floating sources. The drive transistors are common-gate switches with their gates biased by a compensating bias generator. The p-channel drive transistor current variations with Vds are compensated by providing a similar current variation to the n-channel drive transistor. Thus the bias is adjusted to compensate for drain-source voltage changes that can cause the up and down currents from the drive transistors to mismatch. The drive transistors are switched on and off by the up and down input pulses by current sources that steer additional current through the supply transistors. The additional current raises the n-channel drive transistor source to turn off the down current. Additional current from a current source also lowers the p-channel drive transistor's source to turn it off. The same polarity and threshold are used for both up and down input pulses, further reducing phase error.

20 Claims, 5 Drawing Sheets

6,124,741

ACCURATE PLL CHARGE PUMP WITH MATCHED UP/DOWN CURRENTS FROM VDS-COMPENSATED COMMON-GATE SWITCHES

FIELD OF THE INVENTION

This invention relates to charge pumps for phase-locked loops (PLL's), and more particularly to accurate CMOS charge pumps.

BACKGROUND OF THE INVENTION

Many digital systems rely on accurate clocks to synchronize the timing of operations and data transfers. A crystal oscillator is often used to generate a clock at a base frequency, which is then divided or multiplied to create one ore more clocks with desired frequencies. External clock can be received and likewise divided or multiplied to produce internal clocks.

Clocks are typically generated from oscillator outputs using phase-locked loops (PLL's). PLLs are one of the most widely use building blocks in digital systems today. FIG. 1 illustrates a typical PLL. Phase detector 10 receives a reference-clock input from an external oscillator or clock source. The phase and frequency of the reference clock is compared to the phase and frequency of a feedback clock generated by voltage-controlled oscillator (VCO) 14. The feedback clock can be the output clock generated by the PLL, or a divided-down derivative of the output clock from VCO 14.

Phase detector 10 outputs up and down signals UP, DN when the phase or frequency of one input does not match the phase or frequency of the other input. These up and down signals cause charge pump 12 to add or remove charge from filter capacitor 20, which integrates the charge. As charge is added or removed from filter capacitor 20, the voltage input to VCO 14 is increased or decreased. VCO 14 responds by increasing or decreasing the frequency of the output clock. The feedback clock to phase detector 10 is likewise changed by VCO 14.

As charge pump 12 adds or removes charge from filter capacitor 20, altering control voltage $V_{CTL}$ input to VCO 14, the phase and frequency of the feedback clock are adjusted until the reference clock is matched. Then phase detector 10 stops generating up and down signals to charge pump 12, until charge leaks off filter capacitor 20 or the reference clock changes.

Pulses of short duration are often used for up and down signals UP, DN. For example, phase detector 10 can be a pair of simple flip-flops. One flip-flop outputs the UP pulse when clocked by the reference-clock input. The UP pulse ends when cleared by the feedback-clock input. The other flip-flop generates the DN pulse when clocked by the feedback-clock input. The DN pulse ends when cleared by the reference-clock input. As the phases match more closely, the duration of the pulses shorten.

Often both up and down signals are pulsed simultaneously when no phase adjustment is needed. Charge pump 12 should supply either no charge or equal up and down charges to filter capacitor 20 so that a net zero charge is supplied when the duration of simultaneous UP and DN pulses are identical.

Since clocks are intended to be stable, most of the time charge pump 12 is outputting a net zero charge to filter capacitor 20. If the UP and DN sections of charge pump 12 are not matched exactly, some net charge may be applied to filter capacitor 20. This net charge results in a phase error, since VCO 14 responds by slightly changing the phase and frequency of the feedback clock so that it no longer exactly matches the reference clock.

FIG. 2 is a timing diagram of UP and DOWN inputs to a charge pump and the resulting control voltage to the VCO. When a leading phase difference is detected by the phase detector, an UP pulse is generated. The charge pump responds to the UP pulse by pumping positive charge to the filter capacitor, increasing the control voltage $V_{CTL}$ to the VCO. The amount of charge pumped to the filter capacitor depends on the duration of the UP pulse. Once the UP pulse ends, the control voltage remains stable.

When a lagging phase difference is detected by the phase detector, a DN pulse is generated. The charge pump responds to the DN pulse by sinking charge from the filter capacitor, decreasing the control voltage $V_{CTL}$ to the VCO. The amount of charge pumped from the filter capacitor depends on the duration of the DN pulse. Once the DN pulse ends, the control voltage remains stable.

Finally, as FIG. 2 shows, the phases are matched and the phase detector outputs both UP and DN pulses simultaneously. The control voltage should not change, but the charge pump is not perfect and causes some noise on the control voltage as transistors in the charge pump are switched on and off by the UP and DN pulses. Should the UP and DN pump transistors not match, a net charge can be added to the control voltage as shown. This net charge is an error caused by the charge pump that reduces the accuracy of the PLL.

CHARGE PUMP—FIG. 3

Charge pumps are often constructed using complementary metal-oxide-semiconductor (CMOS) transistors. CMOS charge pumps can have errors because the p-channel and n-channel transistors are not exactly matched. The p-channel transistors are often wider than the n-channel to account for the higher electron mobility than the hole mobility. The wider transistor has higher parasitic capacitances, which result in more charge injection during switching than the n-channel transistors. Compounding the problem is that p- and n-channel devices differ in their response to variations in process, voltage, and temperature. This p/n mismatch is particularly severe when the transistor drains are connected to the control voltage and the gates are switched on and off by the UP, DN pulses. Thus standard CMOS push-pull logic arrangements yields poor charge matching.

An example of a source-follower charge pump is disclosed in U.S. Pat. No. 5,508,660 assigned to IBM. This uses a NMOS transistor to drive the control voltage high and a PMOS transistor to drive the control voltage low. The inventor believes that this design suffers from phase error, noise, and process, voltage, temperature tracking problems.

FIG. 3 shows a prior-art source-switched charge pump. P- and n-channel drive transistors 24, 26 are common-gate transistors biased on by constant bias voltages BIASP, BIASN respectively. Transistors 24, 26 are switched on and off by raising and lowering their source voltages, and are thus controlled by their sources, or source-switched.

When the down pulse DN is pulsed high, n-channel transistor 28 turns on. This charges the source of n-channel drive transistor 26, lowering its source voltage until the gate-to-source voltage exceeds the n-channel threshold. Current then flows from the up filter capacitor 20, through n-channel transistors 26, 28, to ground to discharge filter capacitor 20, decreasing the control voltage $V_{CTL}$.

When the up pulse UP is received, its inverse UPB is pulsed low, turning on p-channel transistor 22. This charges the source of p-channel drive transistor 24, raising its voltage until the gate-to-source voltage difference exceeds the p-channel threshold. Current then flows from the power supply, through p-channel transistors 22, 24 to charge up filter capacitor 20, increasing the control voltage $V_{CTL}$.

The supply transistors 22, 28 are actively switched on and off by the UPB and DN pulses, switching the source voltages of drive transistors 24, 26 to turn these transistors on and off. See for example U.S. Pat. No. 5,646,563 by Kuo, assigned to National Semiconductor Corp. of Santa Clara Calif.

PHASE ERROR—FLOATING SOURCES, VDS, INVERSE UP, DN

When supply transistors 22, 28 are switched off, the source nodes of drive transistors 24, 26 are left floating. This is undesirable since the turn off time depends on a slow decaying gm/C response, allowing additional charge to be taken from the filter capacitor. The inventor believes that this results in a significant phase error.

Mis-match of the capacitances of the P and N transistors connected to the filter-capacitor node also can cause phase error. Voltage swings on these parasitic capacitances injects charge into the filter capacitor. When the p-channel transistor is larger and has more capacitance than the n-channel transistor, charge may be added to the filter capacitor when the charge pump switched on and off. This charge may not be cancelled out, resulting in a net charge accumulated on the filter capacitor. This accumulated charge alters the phase matching of the PLL phase detector, causing non-simultaneous input-clock edges to be detected as being in phase.

The charge transferred to the filter capacitor may depend not just on the gate voltages of drive transistors 24, 26, BIASP and BIASN, but also on the drain-source voltages. The gate voltages BIASP and BIASN are independent of the drain-source voltages of drive transistors 24, 26. This results in further mismatch and phase error.

The up and down pulses that control the prior-art charge pump of FIG. 3 have opposite polarity. A low-going UPB pulse is used with a high-going DN pulse. Further mismatch can occur since the UPB and DN logic from the phase detector may not be exactly matched in delay. When the phase detector outputs only positive-logic pulses, an extra delay occurs in the charge pump to invert UP to UPB. The pulse widths and rise and fall times are often altered by the extra inversion as well. The extra delay and skews may cause phase error for simultaneous UP and DN pulses.

What is desired is a more accurate CMOS charge pump. It is desired to further reduce phase error from drain-source voltage mis-match of p-channel and n-channel transistors in the charge pump. It is desired to reduce phase error and the slow response caused by floating source nodes in the charge pump. A charge pump that uses UP and DN signals from the phase detector having the same polarity is desired. A charge pump with closely matched charge and discharge currents is desired.

SUMMARY OF THE INVENTION

A charge pump has an up input and a down input to the charge pump. An output has an output capacitance to be charged in response to the up input and discharged in response to the down input. A charging common-gate switch is coupled to the output to charge the output capacitance in response to the up input. The charging common-gate switch has a control gate coupled to an upper bias voltage. The charging common-gate switch is coupled to conduct current from an upper source node to the output in response to a voltage difference between the upper bias voltage and an upper-source voltage of the upper source node. The upper bias voltage is quasi-constant and not responsive to the up input.

An upper supply resistor is coupled between the upper source node and a power supply. It conducts current to the upper source node. An upper current source is coupled to the upper source node. It draws additional current through the upper supply resistor to lower the upper-source voltage and thereby disables the charging common-gate switch in response to an inactive state of the up input.

A discharging common-gate switch is coupled to the output to discharge the output capacitance in response to the down input. The discharging common-gate switch has a control gate coupled to a lower bias voltage. The discharging common-gate switch is coupled to conduct current from the output to a lower source node in response to a voltage difference between the lower bias voltage and a lower-source voltage of the lower source node. The lower bias voltage is quasi-constant and not responsive to the down input.

A lower supply resistor is coupled between the lower source node and a ground. It conducts current from the lower source node to the ground. A lower current source is coupled to the lower source node. It sources additional current through the lower supply resistor to raise the lower-source voltage and thereby disables the discharging common-gate switch in response to an inactive state of the down input. Thus the upper and lower current sources disable the common-gate switches by raising the lower-source voltage and reducing the upper-source voltage.

In further aspects of the invention the upper source node is not floating when the charging common-gate switch is disabled and the lower source node is not floating when the discharging common-gate switch is disabled. Thus the upper and lower source nodes are not floating nodes.

It still further aspects the upper supply resistor is a p-channel transistor having a gate connected to a ground voltage and the lower supply resistor is an n-channel transistor having a gate connected to a power-supply voltage. Thus transistors operating in a linear region are used as resistors.

In other aspects the charging common-gate switch is a p-channel transistor with a drain connected to the output, a source connected to the upper source node, and a gate connected to the upper bias voltage. The discharging common-gate switch is an n-channel transistor with a drain connected to the output, a source connected to the lower source node, and a gate connected to the lower bias voltage.

The lower current source has a current source coupled to the power supply. It supplies a constant current. An n-channel switch transistor has a gate coupled to the down input. The down input is active in a low-voltage state. It switches the constant current from the current source to the lower source node in response to the down input in the inactive state. The upper current source has a current sink coupled to ground. It sinks a second constant current. A second n-channel switch transistor has a gate coupled to the up input. The up input is active in a low-voltage state. It switches the second constant current from the upper source node to the current sink to in response to the up input in the inactive state. Thus current is switched to the upper and lower source nodes by n-channel switch transistors.

In further aspects the up input and the down input have a same polarity and the charge pump responds to a same logic threshold for both the up input and the down input. Thus same polarity and threshold input for up and down charging are employed by the charge pump.

DETAILED DESCRIPTION

The present invention relates to an improvement in PLL charge pumps. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventor has realized that source-switched charge pumps using common-gate drive transistors potentially have less phase error that other kinds of charge pumps that actively switch the gates of the drive transistors. While the gate voltage of a common-gate transistor is kept constant in the strict definition of the term "common gate", the inventor has realized that the gate voltages can be adjusted somewhat to account for drain-source voltage mismatch of the drive transistors. This $V_{DS}$ tracking is described more fully with reference to FIG. 6. The gate bias voltages BIASP, BIASN can be adjusted somewhat for $V_{DS}$ tracking and yet the drive transistors still retain their common-gate characteristics.

The inventor has also realized that prior-art source-switched designs suffer from leaving the sources of the drive transistors floating when the supply transistors are turned off. Instead, the inventor effectively replaces the passively driven supply transistors with resistor devices so that the sources are not left floating. For CMOS integrated circuits (ICs), resistor devices are implemented as transistors biased in the linear region and left on rather than switched on and off. A current source and sink then switch current into the p-channel source nodes and the resistor devices to raise and lower the p-channel source voltages. An n-channel voltage drive is applied to the respective node of the channel transistor. The drive transistors are then switched on and off as the source voltages are raised and lowered. The current source and sink are configured so that the UP and DN pulses that control the current source and sink have the same logic polarity and threshold.

SOURCES SWITCHED BY CURRENT SWITCHED THROUGH SUPPLY RESISTORS— FIG. 4

Figure 1:
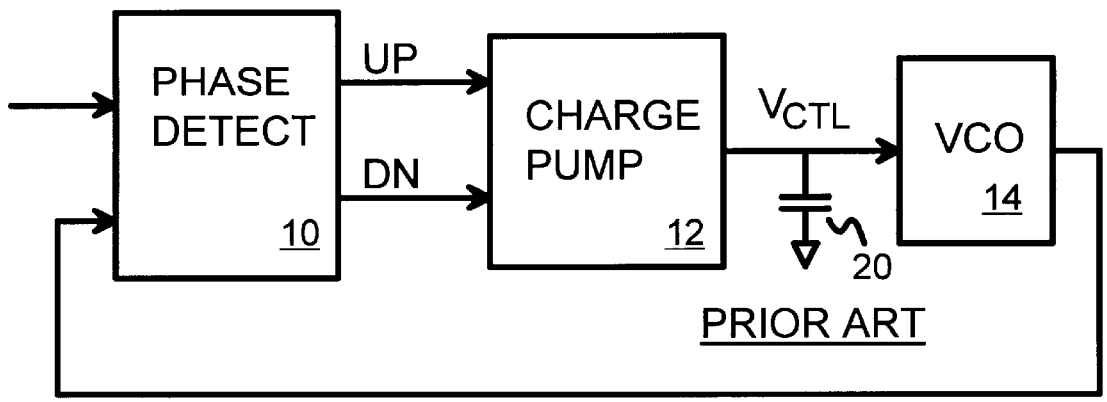
FIG. 1 illustrates a typical PLL.
Figure 2:
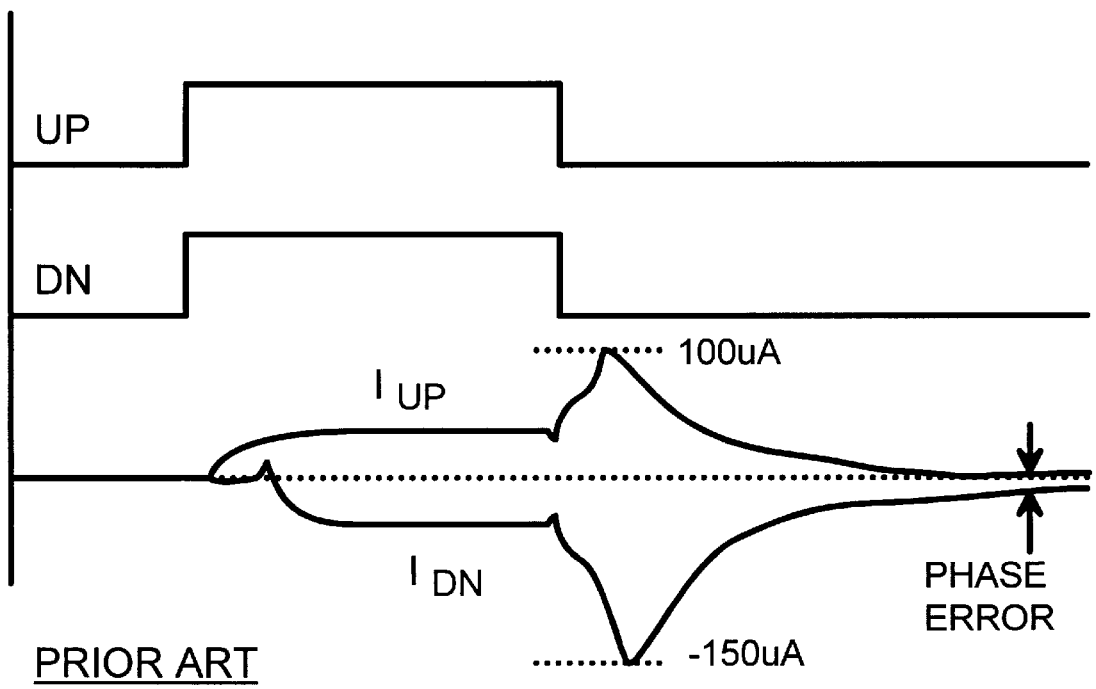
FIG. 2 is a timing diagram of UP and DOWN inputs to a charge pump and the resulting control voltage to the VCO.
Figures 3, 4:
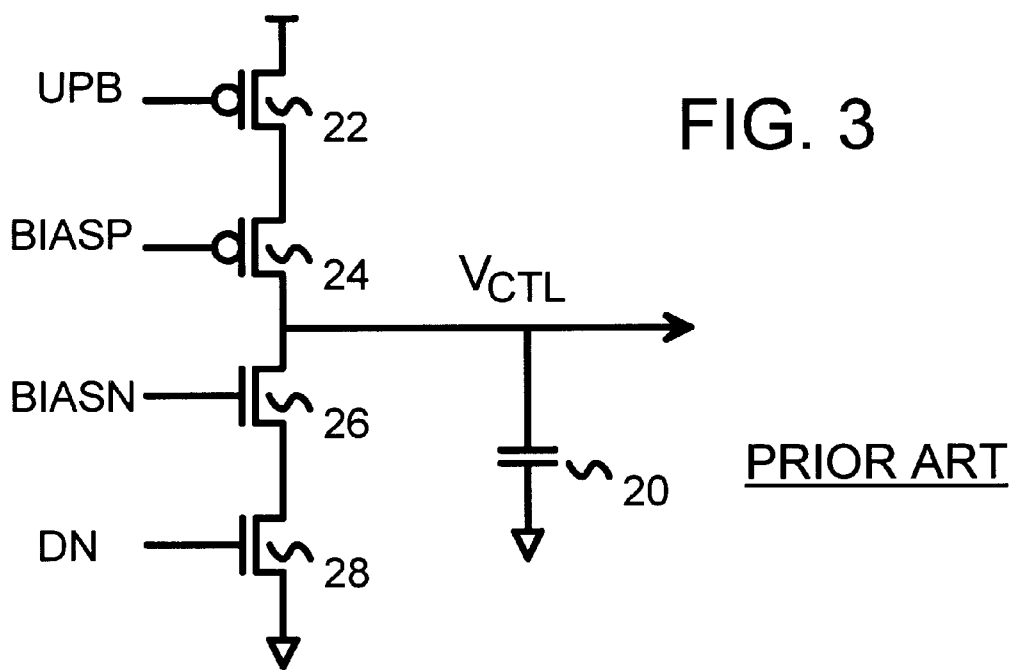
FIG. 3 shows a prior-art source-switched charge pump.
FIG. 4 illustrates a charge pump with drive transistors switched at their sources by current switched through resistors.

FIG. 4 illustrates a charge pump with drive transistors switched at their sources by current switched through resistors. Charge is added to filter capacitor 20, increasing control voltage $V_{CTL}$ to the VCO in response to an UPB pulse from a PLL phase detector. Charge is removed from filter capacitor 20, decreasing control voltage $V_{CTL}$ to the VCO in response to a DNB pulse from a PLL phase detector. Inverse-logic up and down pulses UPB, DNB are used rather than positive-logic pulses.

Drive transistors 24, 26 are common-gate switches that are connected to the control-voltage output at their drains. Their gates are each connected to a quasi-constant bias voltage, BIASP for p-channel drive transistor 24 and BIASN for n-channel drive transistor 26. The source nodes 36, 38 of drive transistors 24, 26 are varied in voltage, switching drive transistors 24, 26 on and off as the gate-to-source voltages are switched above and below the transistor turn-on voltage (threshold). Thus drive transistors 24, 26 and the charge pump are source-switched.

In the prior art of FIG. 3, supply transistors 22, 28 were switched on and off by the UP and DN pulses from the phase detector. The invention does not switch supply transistors 22, 28, but rather leaves these transistors on. Supply transistors 22, 28 are biased in the linear region since their gates are connected to full-rail supplies. P-channel supply transistor 22 has its gate connected to ground while n-channel supply transistor 28 has its gate connected to the power supply. Thus large gate-source voltages are applied to supply transistors 22, 28, causing them to be biased on in the linear region.

Since supply transistors 22, 28 are biased on in the linear region, they behave as resistors. An IR voltage drop is developed across them when current flows through them. This IR voltage drop varies with the current, although the resistance is not exactly linear since transistors are not perfect resistors.

Current sources 32, 34 are controlled by the inverse up and down pulses UPB, DNB. When no active pulse is generated, UPB and DNB are high, turning on current sources 32, 34.

Current source 34 forces its current through supply transistor 28, increasing the IR voltage drop through supply transistor 28. This current from current source 34 thus raises the source voltage on node 38. As the voltage of node 38 rises to within a threshold of BIASN, drive transistor 26 turns off. Thus DNB turns on current source 34 raising the source voltage on node 38, turning off drive transistor 26. During the down pulse, when DNB is pulsed low, current source 34 shuts off, reducing the current through supply transistor 28, lowering the source voltage on node 38, turning on drive transistor 26 as the source voltage drops below BIASN by a threshold.

Current source 32 pulls its current through p-channel supply transistor 22, increasing the IR voltage drop through supply transistor 22. This current from current source 32 thus lowers the source voltage on node 36. As the voltage of node 36 falls to within a threshold of BIASP, drive transistor 24 turns off. UPB turns on current source 32 raising the source voltage on node 36, turning off drive transistor 24. During the up pulse, when UPB is pulsed low, current source 32 shuts off, reducing the current through supply transistor 22, raising the source voltage on node 36, turning on drive transistor 24 as the source voltage rises above BIASN by a threshold.

Current is switched by current sources 32, 34 through supply transistors 22, 28, altering the source voltages on nodes 36, 38. Drive transistors 24, 26 are switched on and off by the change in the source voltages on nodes 36, 38. Thus source switching is accomplished by current switching through resistive supply transistors.

CURRENT STEERING TO MINIMIZE SUPPLY NOISE—FIG. 5

Figure 5:
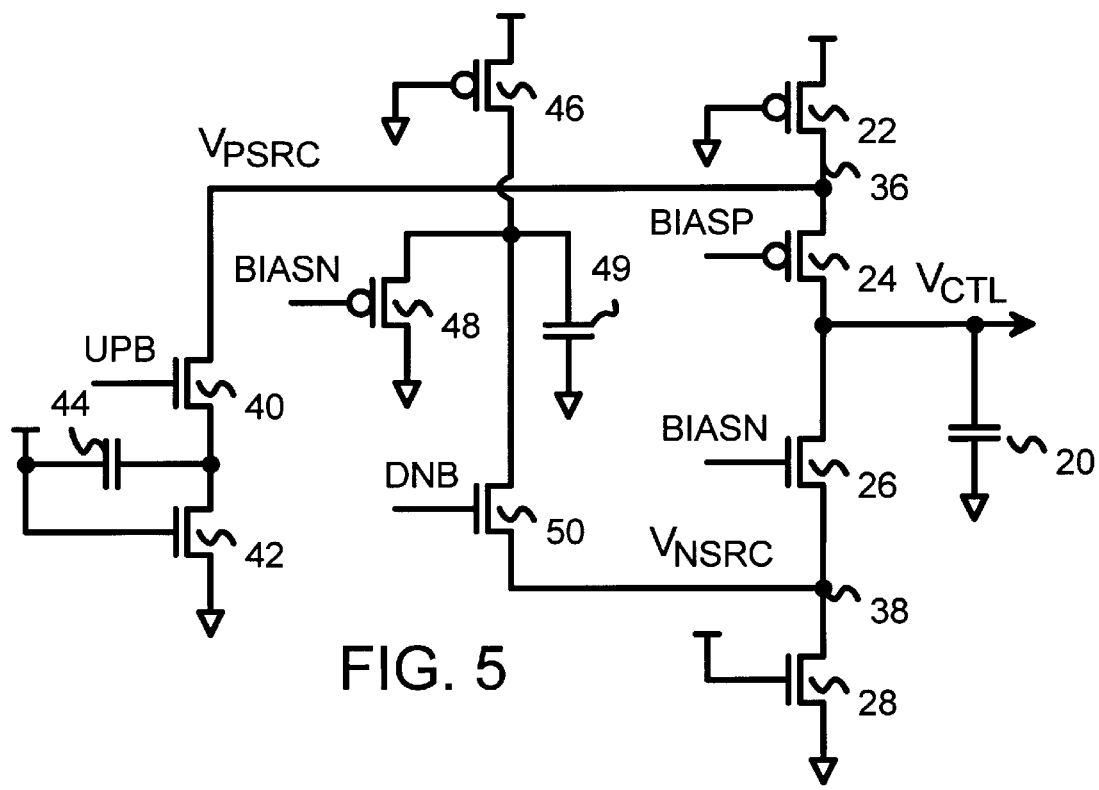
FIG. 5 is a schematic of a current-steering circuit for the source-switched charge pump.

FIG. 5 is a schematic of a current-steering circuit for the source-switched charge pump. FIG. 5 shows in more detail an implementation of the basic current-switching concept of FIG. 4. Current source 34 of FIG. 4 is implemented by transistors 46, 48, 50, while current source 32 is implemented by transistors 40, 42.

When the up pulse is received, UPB is pulsed low, and n-channel current-switch transistor 40 turns off the current pulled through supply transistor 22. This raises the source voltage $V_{PSRC}$ of node 36, turning on drive transistor 24. Charge is then added to filter capacitor 20. At the end of the up pulse, UPB goes high, turning on current-switch transistor 40. Current flows through supply transistor 22, lowering the source voltage of node 36, turning off drive transistor 24.

N-channel transistor 42 has its gate connected to the power supply, and thus acts as a current-limiting resistor when current-switch transistor 40 is on. Capacitor 44 filters out supply noise that can occur during current switching. Capacitor 44 shunts current pulses from transistor 40, preventing them from flowing through the bond wires to the external power supply. This limits IR and inductive switching noise on the internal chip supply.

In a similar fashion, n-channel current-switch transistor 50 switches current through n-channel supply transistor 28, raising and lowering the source voltage $V_{NSRC}$ on node 38. This turns drive transistor 26 on and off. P-channel transistor 46 has its gate connected to the power supply, and thus also acts as a current-limiting resistor, controlling the current switched by current-switch transistor 50. Capacitor 49 filters out ground and supply noise that can occur during current switching. Capacitor 49 shunts current pulses in similar fashion to Capacitor 40, with similar reduced IR and inductive switching noise on the internal chip supply. Thus di/dt and supply noise are reduced.

Since n-channel current-switch transistors 40, 50 are employed for both up and down pulses, the same logic polarity is used for the up and down inputs from the phase detector. Inverter skews are avoided, resulting in better matching. Since n-channel transistors 42 and 28 tend to match, and both have gates connected to power, the gate-voltage needed to switch current-switch transistors 40, 50 is the same for both up and down pulses. Thus not only are the same input polarities used, the same input thresholds are used. This results in good matching of up and down charging, and in reducing the net charge and phase error.

VDS TRACKING OF GATE BIAS—FIG. 6

Figure 6:
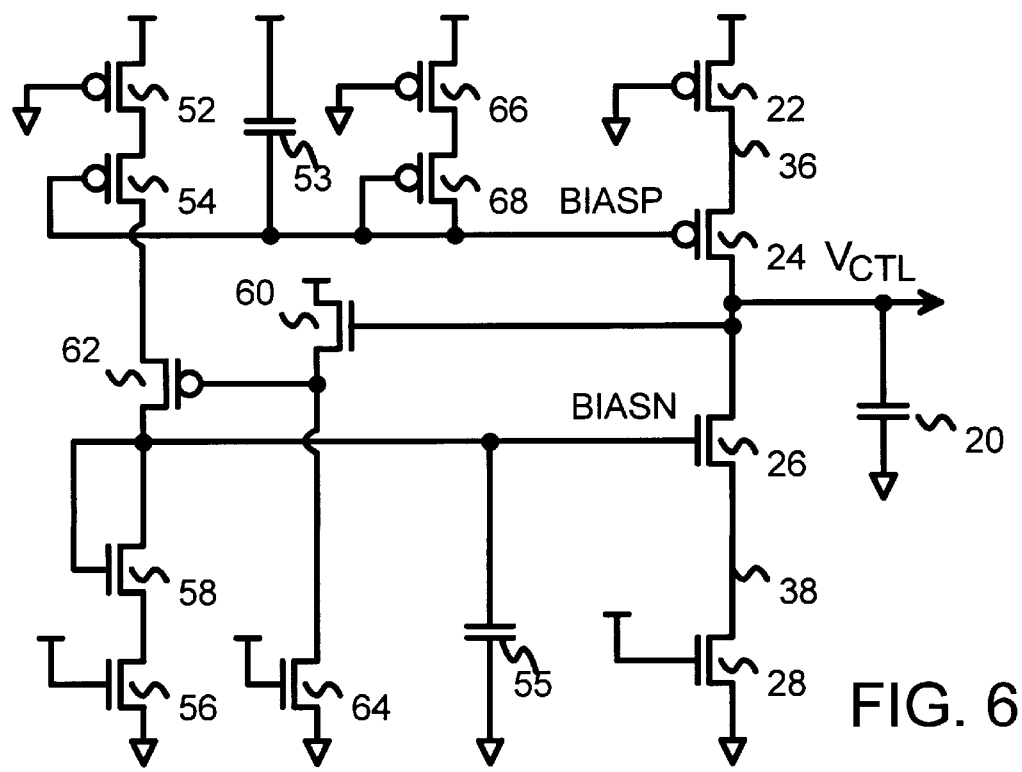
FIG. 6 is a schematic of a drain-source-voltage tracking circuit for a common-gate charge pump.

FIG. 6 is a schematic of a drain-source-voltage tracking circuit for a common-gate charge pump. Rather than connect each drive transistor 24, 26 to a static bias voltage, the gate-bias voltages are adjusted as the drain voltage (control voltage) changes. Adjustment of the gate bias allows for better matching of the currents through the p and n drive transistors 24, 26.

The current-switching circuit of FIG. 5 is connected to source nodes 36, 38, but is not shown in FIG. 6 for clarity. The entire circuit is shown later in FIG. 9. Source transistors 22, 28 are biased with full-rail supplies and thus operate in the linear region as resistors. The source voltages $V_{PSRC}$ and $V_{NSRC}$ of nodes 36, 38 are pulled slightly higher and lower by current switched through supply transistors 22, 28 to turn drive transistors 24, 26 on and off. Capacitors 53, 55 provide filtering of power and ground noise, stabilizing the bias voltages BIASP, BIASN against supply noise.

The voltage BIASP is determined by p-channel bias transistors 66, 68. Transistor 66 has its gate connected to ground, so is on in the linear region. Its drain is connected to the source of bias transistor 68, which has its gate and drains connected together. A bias current source is applied to the gate/drain of transistor 68, providing a current path from supply, through transistors 66,68 and the current source to ground. Since transistor 68 is operating in the saturation region, the bias voltage BIASP generated is somewhat below one p-channel threshold below the power supply, or about 2.0 volts for a 3.3-volt supply. When UPB is low, transistor 50 is off, and supply transistor 22 current is steered through transistor 24.

Bias transistor 66 matches supply transistor 22, both having sources connected to the 10 power supply and gates connected to ground. Since currents are matched (or their ratios match) when drive transistor 24 is on, the drains of transistors 66,22 match in voltage, so that the Vgs of drive transistor 24 matches that of bias transistor 68. Bias transistor 68 matches the current of drive transistor 24, either exactly, or in a ratio determined by the transistor size (W/L) ratios.

When UPB is high, transistor 50 is on, and supply transistor 22 current is steered through transistor 50. Transistor 24 is switched off.

The gate bias BIASN of drive transistor 24 is generated in a similar manner. N-channel transistor 56 matches supply transistor 28 and has its gate connected to power. Bias n-channel transistor 58 has its gate and drain connected together, generating BIASN. Bias transistors 58, 56 match or ratio the nominal current through drive transistor 26 and supply transistor 28 when DNB is low.

Since small, short-channel devices are used, differing $V_{DS}$ and impedance effects can cause current mismatches in drive transistors 24, 26 A Vds matching circuit is employed to counter these effects. Source-follower transistors 60,62 transmit changes in the control voltage Vctl output to the drain of transistor 54. Thus the drain voltages of transistor 24 and 54 are nearly equal and currents in them tend to match better than when they are allowed to have different drain voltages. Transistor 60 acts as a source follower, following the voltage Vctl–Vgs. Transistor 64 acts as a bias source for transistor 60, biasing transistor 60 source at Vctl–Vgs. Transistor 62 receives bias current from transistor 54, causing transistor 62 source voltage to be transistor 60 source voltage plus Vgs. Since the Vgs are of opposite polarity and nearly equal, they tend to cancel.

The result is that transistor 54 and 24 drain voltages tend to match. Transistor 54,24 drain currents will then match better than if the drain voltages were allowed to be different. Transistor 54 drain current is transferred through transistor 62 to transistors 58,56. Bias transistor 56 matches bias transistor 28, both having their gates connected to supply and their sources connected to ground. Transistors 58 and 26 match, having the same size, gate voltage, and source voltage.

Since matching transistor 54,24 drains are both at voltage Vctl, when Vctl changes, both transistor drain currents change similarly. This change is transmitted to transistors 58,56 and 26,28 in the manner described, so that any change in transistor 24 drain current results in a similar change in transistor 26 drain current. Thus changes in Vds are compensated for by adjusting the currents of the down switch transistor to match the current of the up switch transistor.

SOURCE DROPS TO TURN ON DRIVER—FIG. 7

Figure 7:
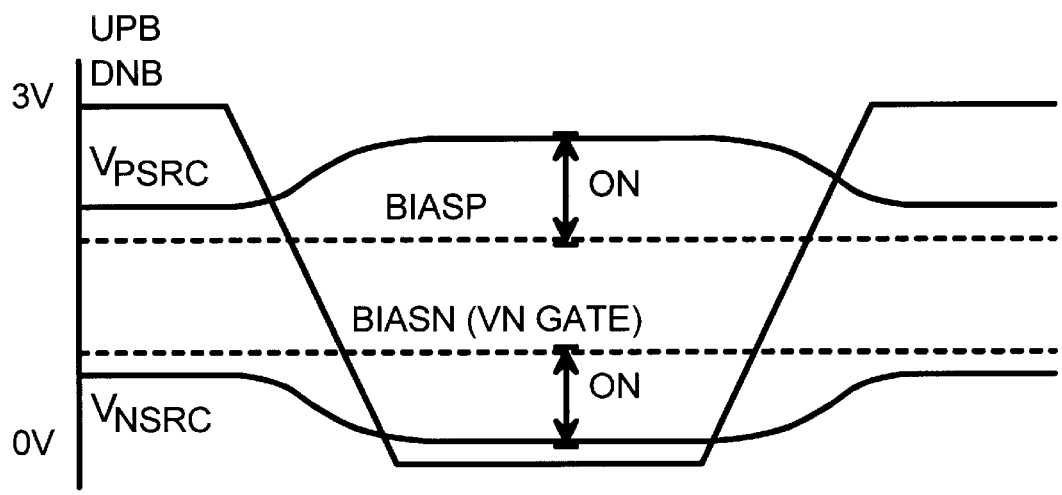
FIG. 7 is a graph of source voltages when simultaneous up and down pulses are applied to the charge pump.

FIG. 7 is a graph of source voltages when simultaneous up and down pulses are applied to the charge pump. When the phase detector pulses both the up and down pulses at the same time, and for the same duration, the charge pump responds by enabling both p-channel and n-channel drive transistors.

FIG. 7 shows simultaneous low-going pulses of UPB, DNB. The bias voltages BIASP, BIASN applied to the gates of the drive transistors are shown as dashed lines. In response to the beginning of the DNB pulse, the current source steers the additional current to ground rater than through the n-channel supply transistor. A lower voltage drop is produced through the supply transistor, lowering the source voltage $V_{NSRC}$. Once $V_{NSRC}$ falls so that the gate voltage BIASN is at least an n-channel threshold above the source $V_{NSRC}$, the n-channel drive transistor turns on. The filter capacitor is discharged by the n-channel driver transistor until the end of the DNB pulse occurs. Then current is steered through the supply transistor, raising the source voltage $V_{NSRC}$ until the n-channel driver transistor turns off.

The simultaneous up pulse also activates the charge pump. In response to the beginning of the UPB pulse, the UP current source stops pulling current through the p-channel supply transistor. A lower voltage drop is produced through the supply transistor, raising the source voltage $V_{PSRC}$ closer to the power supply voltage Once $V_{PSRC}$ rises so that the gate voltage BIASP is at least a p-channel threshold below the source $V_{PSRC}$, the p-channel drive transistor turns on. The filter capacitor is charged by the p-channel driver transistor until the end of the UPB pulse occurs. Then current is pulled through the supply transistor, lowering the source voltage $V_{PSRC}$ until the p-channel driver transistor turns off.

MATCHED P/N CURRENTS CANCEL—FIG. 8

Figure 8A:
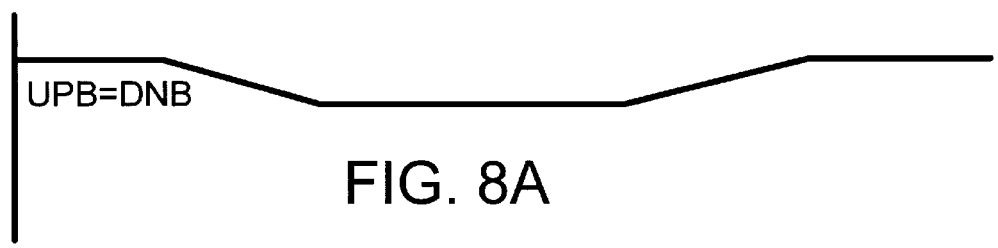
FIGS. 8A, 8B are graphs of the control voltage and output currents when simultaneous up and down pulses are applied to the charge pump.
Figure 8B:
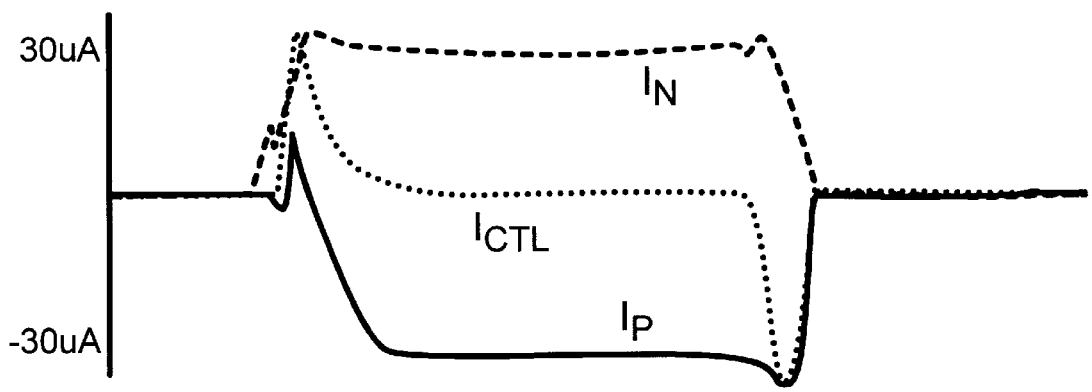

FIGS. 8A, 8B are graphs of the control voltage and output currents when simultaneous up and down pulses are applied to the charge pump. When the phase detector pulses both the up and down pulses at the same time, and for the same duration, the charge pump responds by enabling both p-channel and n-channel drive transistors. If the currents from the p-channel and n-channel drive transistors match, there should be no net charge applied to the filter capacitor.

In FIG. 8A, the simultaneous UPB, DNB low-going pulses are applied to the charge pump. The control voltage VCTL is output by the charge pump as the drive transistors in the charge pump charge and discharge the filter capacitor connected to the output. As can be seen, the sum of the up/down currents is nearly zero, imparting little charge to the filter connected at the output. The filter voltage, Vctl, is little disturbed by the up/down transient.

In FIG. 8B, the up and down currents generated by the UPB and DNB pulses of FIG. 8B are shown. The up and down currents shown in FIG. 8B are nearly square pulses with relatively flat tops and fast rise and fall times. The p-channel switch size is larger because p-channel conductivity is lower, and thus switching spikes are larger in the p-channel current waveform. The short turn-on transient is followed by an opposite polarity turn off transient which tends to cancel. The n-channel transistor down current has almost no spikes. The n-channel current switches first because it is switched by n-channel transistor 50 in common-drain (voltage-follower) configuration. This is a very fast non-inverting configuration. Its speed is enhanced by the fact that the DNB signal is AC-coupled to Vnsrc by its Vgs capacitance. By contrast, UPB signal is transmitted to Vpsrc by n-channel transistor 40 in common-source configuration. This configuration is only slightly slower because it is inverting, and the input signal tends to couple in the opposite direction of Vpsrc. As can be seen from the currents in FIG. 8B, the up/down currents are nearly equal. As long as the current pulses are equal area (current×time), phase error will be low. The turn on/off times have little effect on the error, because the filter capacitor integrates the total charge slowly and because the turn on/off times are so nearly equal.

The net current to the output is the sum of the up current $I_P$ from the p-channel drive transistor and the down current $I_N$ from the n-channel drive transistor. This is shown as $I_{CTL}$ in FIG. 8B. As can be seen, the net current from the charge pump is small as the up and down currents tend to cancel.

POWER-DOWN OPTION—FIG. 9

Figure 9:
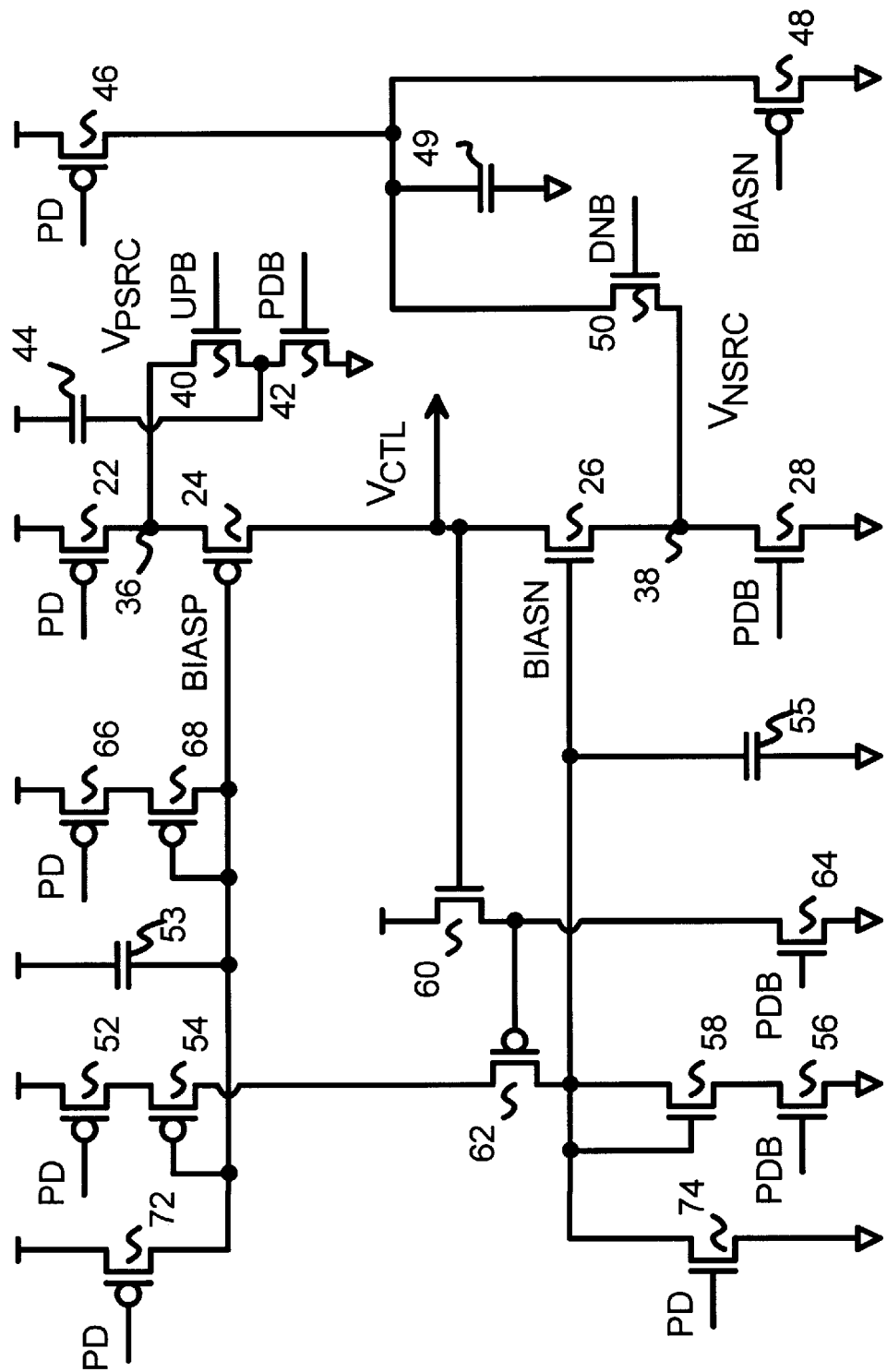
FIG. 9 is a preferred embodiment that can be powered down.

FIG. 9 is a preferred embodiment that can be powered down. Power-down signal PD and its inverse PDB are used in place of ground and the power supply to the gates of various transistors. PD replaces ground to the gates of p-channel transistors 22, 52, 46, and 66, while PDB replaces power to the gates of n-channel transistors 28, 42, 56, and 64. Power-down transistor 72 drives the bias voltage BIASP to the power supply while power-down transistor 74 drives the bias voltage BIASN to ground during power down.

FIG. 9 shows both the current-switching and steering logic of FIG. 5 and the drain-source tracking circuit of FIG. 6 on the same diagram. Devices described earlier operate in the manner described during full-power mode.

ADVANTAGES OF THE INVENTION

A more accurate CMOS charge pump reduces phase error in a PLL. Drain-source voltage mis-match of p-channel and n-channel transistors in the charge pump is reduced. Phase error and slow response are reduced since the prior-art floating source nodes are eliminated. The charge pump uses UP and DN signals from the phase detector with the same polarity and threshold. The charge and discharge currents are closely matched.

Switching is fast due to the small signal voltage swings. The source nodes only have to swing by about the threshold voltage, which is much less than the full-rail voltage.

Since n-channel current-switch transistors are employed for both up and down pulses, the same logic polarity is used for the up and down inputs from the phase detector. Inverter skews are avoided, resulting in better matching. Since n-channel transistors connected to the current-switch transistors tend to match, and both have gates connected to power, the gate-voltage needed to switch the current-switch transistors is the same for both up and down pulses. Thus not only are the same input polarities used, the same input thresholds are used. This results in good matching of up and down charging, and in reducing the net charge and phase error.

Since turning the current-switch transistor on and off can quickly switch a large current from the power supply, di/dt of supply current can be a problem. A shunt p-channel transistor acts to shunt the current to ground when switching occurs, reducing the change in current drawn from the power supply. Thus di/dt and supply noise are reduced.

ALTERNATE EMBODIMENTS

Several other embodiments are contemplated by the inventor. For example p and n-channel devices can be swapped. Positive rather than negative up and down pulses can be used as inputs. Inversions of signals can be included. Device sizes can vary, and newer processes and circuits can be employed with the invention. Devices other than MOS transistors can be used.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

I claim:

1. A charge pump comprising:

an up input and a down input to the charge pump;

an output having an output capacitance to be charged in response to the up input and discharged in response to the down input;

a charging common-gate switch, coupled to the output to charge the output capacitance in response to the up input, the charging common-gate switch having a control gate coupled to an upper bias voltage, the charging common-gate switch coupled to conduct current from an upper source node to the output in response to a voltage difference between the upper bias voltage and an upper-source voltage of the upper source node;

wherein the upper bias voltage is quasi-constant and not responsive to the up input;

an upper supply resistor, coupled between the upper source node and a power supply, for conducting current to the upper source node;

an upper current source, coupled to the upper source node, for drawing additional current through the upper supply resistor to lower the upper-source voltage and thereby disable the charging common-gate switch in response to an inactive state of the up input;

a discharging common-gate switch, coupled to the output to discharge the output capacitance in response to the down input, the discharging common-gate switch having a control gate coupled to a lower bias voltage, the discharging common-gate switch coupled to conduct current from the output to a lower source node in response to a voltage difference between the lower bias voltage and a lower-source voltage of the lower source node;

wherein the lower bias voltage is quasi-constant and not responsive to the down input;

a lower supply resistor, coupled between the lower source node and a ground, for conducting current from the lower source node to the ground; and a lower current source, coupled to the lower source node, for sourcing additional current through the lower supply resistor to raise the lower-source voltage and thereby disable the discharging common-gate switch in response to an inactive state of the down input, whereby the upper and lower current sources disable the common-gate switches by raising the lower-source voltage and reducing the upper-source voltage.

2. The charge pump of claim 1 wherein the upper source node is not floating when the charging common-gate switch is disabled and the lower source node is not floating when the discharging common-gate switch is disabled, whereby the upper and lower source nodes are not floating nodes.

3. The charge pump of claim 2 wherein the upper supply resistor is a p-channel transistor having a gate connected to a ground voltage and wherein the lower supply resistor is an n-channel transistor having a gate connected to a power-supply voltage, whereby transistors operating in a linear region are used as resistors.

4. The charge pump of claim 3 wherein the charging common-gate switch is a p-channel transistor with a drain connected to the output, a source connected to the upper source node, and a gate connected to the upper bias voltage;

wherein the discharging common-gate switch is an n-channel transistor with a drain connected to the output, a source connected to the lower source node, and a gate connected to the lower bias voltage.

5. The charge pump of claim 4 wherein the lower current source comprises:

a current source, coupled to the power supply, for supplying a constant current;

an n-channel switch transistor, having a gate coupled to the down input, the down input being active in a low-voltage state, for switching the constant current from the current source to the lower source node in response to the down input in the inactive state;

wherein the upper current source comprise:

a current sink, coupled to ground, for sinking a second constant current;

a second n-channel switch transistor, having a gate coupled to the up input, the up input being active in a low-voltage state, for switching the second constant current from the upper source node to the current sink to in response to the up input in the inactive state, whereby current is switched to the upper and lower source nodes by n-channel switch transistors.

6. The charge pump of claim 5 wherein the up input and the down input have a same polarity and the charge pump responds to a same logic threshold for both the up input and the down input, whereby same polarity and threshold input for up and down charging are employed by the charge pump.

7. The charge pump of claim 6 wherein the lower current source further comprises:

a current shunt, coupled to the current source, for switching the constant current from the current source to ground when the n-channel switch transistor is disabled by the down input being in the active state, whereby the constant current is switched to the lower source node or to ground, reducing power-supply noise when the down input is pulsed.

8. The charge pump of claim 7 wherein the current shunt comprises a p-channel transistor with a gate coupled to the lower bias voltage and wherein the lower current source further comprises:

a filter capacitor, coupled from the current shunt and the n-channel switch transistor to ground, for reducing noise.

9. The charge pump of claim 6 further comprising:

a drain-source compensator, coupled to the output, for adjusting the lower bias voltage relative to the upper bias voltage in response to changes in the output voltage, whereby differences in drain-to-source voltage across the charging and discharging common-gate transistors are compensated for by adjusting quasi-constant bias voltages.

10. The charge pump of claim 9 wherein the drain-source compensator comprises:

a feedback source follower, having a gate connected to the output and a source voltage responsive to voltage changes in the output; and a second source follower, having a gate controlled by the source voltage from the feedback source follower, for adjusting the lower bias voltage, whereby source followers compensate for voltage changes in the output to precisely match charging and discharging currents.

11. The charge pump of claim 10 wherein the drain-source compensator further comprises:

a current supply transistor coupled to conduct current from the power supply to the second source follower;

a bias-generating transistor, receiving current from the second source follower, for generating the lower bias voltage in response to current flowing through the second source follower.

12. The charge pump of claim 11 wherein the feedback source follower is an n-channel transistor while the second source follower is a p-channel transistor.

13. An accurate charge pump with matched up and down currents for charging and discharging a filter capacitor on an output, the accurate charge pump comprising:

an UPB input for charging the filter capacitor when pulsed low;

a DNB input for discharging the filter capacitor when pulsed low;

an upper supply transistor having a gate coupled to ground, for conducting current from a power supply to an upper source node;

an upper drive transistor, having a gate coupled to a quasi-constant upper bias voltage, the upper drive transistor conducting current from the upper source node to the output to charge the filter capacitor;

wherein the upper drive transistor conducts in response to voltage changes of the upper source node;

an upper current-switch transistor, coupled to the upper source node, for sinking current from the upper supply transistor to a first node to reduce a voltage of the upper source node and disable the upper drive transistor in response to the UPB input applied to a gate of the upper current-switch transistor;

a current-sink transistor, coupled to conduct current from the first node to ground;

a lower supply transistor having a gate coupled to the power supply, for conducting current from a lower source node to ground;

a lower drive transistor, having a gate coupled to a quasi-constant lower bias voltage, the lower drive transistor conducting current from the output to the lower source node to discharge the filter capacitor;

wherein the lower drive transistor conducts in response to voltage changes of the lower source node;

a lower current-switch transistor, coupled to the lower source node, for sourcing current to the lower supply transistor from a second node to raise a lower source voltage and disable the lower drive transistor in response to the DNB input applied to a gate of the lower current-switch transistor; and a current-source transistor, coupled to conduct current from the power supply to the second node;

wherein the lower drive transistor discharges the filter capacitor when a low-going pulse of the DNB input is received that disables the lower current-switch transistor and lowers a voltage of the lower source node;

wherein the upper drive transistor charges the filter capacitor when a low-going pulse of the UPB input is received that disables the upper current-switch transistor and raises a voltage of the upper source node, whereby the drive transistors are source-switched by current-switch transistors.

14. The accurate charge pump of claim 13 wherein the upper drive transistor is a p-channel transistor operating as a common-gate switch;

wherein the lower drive transistor is an n-channel transistor operating as a common-gate switch;

wherein the upper supply transistor is a p-channel transistor operating in the linear region as a resistor;

wherein the lower supply transistor is an n-channel transistor operating in the linear region as a resistor.

15. The accurate charge pump of claim 14 wherein the lower current-switch transistor is an n-channel transistor with a gate connected to the DNB input and the upper current-switch transistor is an n-channel transistor with a gate connected to the UPB input, whereby n-channel transistors are used to switch currents to adjust source voltages for both the upper and lower source nodes, whereby up and down inputs to the accurate charge pump have a same polarity.

16. The accurate charge pump of claim 15 wherein the current-sink transistor is an n-channel transistor and the current-source transistor is a p-channel transistor.

17. The accurate charge pump of claim 13 further comprising:

an n-channel feedback transistor, having a gate coupled to the output, for adjusting the lower bias voltage in response to voltage changes of the output, whereby changes in drain-voltage of the lower drive transistor are compensated for.

18. The accurate charge pump of claim 13 wherein the filter capacitor and the output are coupled to a voltage-controlled oscillator (VCO), and wherein the UPB and DNB inputs are generated by a phase comparator that compares a phase of and clock generated by the VCO to a reference clock, whereby phase error is reduced by matching charging and discharging currents from the upper drive transistor and the lower drive transistor.

19. An balanced charge pump comprising:

charging transistor means, responsive to changes in an upper source voltage, for supplying a charging current to an output;

upper supply transistor means, coupled to a power supply and to the upper source voltage, for continuously driving the upper source voltage;

upper current-switch means, responsive to an UP input, for reducing current flow through the upper supply transistor means in response to the UP input, whereby the upper source voltage is increased sufficiently to enable the charging transistor means to conduct current to the output;

discharging transistor means, responsive to changes in a lower source voltage, for supplying a discharging current to the output;

lower supply transistor means, coupled to a ground and to the lower source voltage, for continuously driving the lower source voltage; and lower current-switch means, responsive to a DOWN input, for reducing current flow through the lower supply transistor means in response to the DOWN input, whereby the lower source voltage is decreased sufficiently to enable the discharging transistor means to conduct current from the output, whereby the charging and discharging transistor means are source-switched by reducing currents flowing through supply transistor means.

20. The balanced charge pump of claim 19 further comprising:

feedback means, coupled to the output, for generating a bias voltage for controlling current flow through the discharging transistor means, the feedback means adjusting the bias voltage to compensate for changes in a voltage on the output so that a charging current through the charging transistor means more closely matches a discharging current through the discharging transistor means, whereby output feedback adjusts charging and discharging currents.

* * * * *